(12) United States Patent
Taki et al.

(10) Patent No.: US 11,829,083 B2
(45) Date of Patent: Nov. 28, 2023

(54) DETECTION APPARATUS, LITHOGRAPHY APPARATUS, ARTICLE MANUFACTURING METHOD, AND DETECTION METHOD

(71) Applicant: CANON KABUSHIKI KAISHA, Tokyo (JP)

(72) Inventors: Tomokazu Taki, Tokyo (JP); Toshiki Iwai, Tokyo (JP); Hiroyuki Matsuda, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 214 days.

(21) Appl. No.: 17/201,005

(22) Filed: Mar. 15, 2021

(65) Prior Publication Data

US 2021/0318626 A1 Oct. 14, 2021

(30) Foreign Application Priority Data

Apr. 10, 2020 (JP) ................................. 2020-070721

(51) Int. Cl.
*G03F 9/00* (2006.01)
*G03F 7/00* (2006.01)

(52) U.S. Cl.
CPC .......... *G03F 9/7088* (2013.01); *G03F 7/0002* (2013.01); *G03F 9/7065* (2013.01); *G03F 9/7096* (2013.01)

(58) Field of Classification Search
CPC ....... G03F 9/7042; G03F 9/7073–7084; G03F 9/70; G03F 9/7003; G03F 9/7038;
(Continued)

(56) References Cited

U.S. PATENT DOCUMENTS 7,671,990 B1 * 3/2010 Adel ................... G03F 7/70683
356/400
10,732,523 B2 8/2020 Komaki
(Continued)

FOREIGN PATENT DOCUMENTS

| CN | 108508713 A | * | 9/2018 | ........... G03F 9/7046 |
| JP | 2017041608 A | | 2/2017 | |
| JP | 2017215429 A | * | 12/2017 | |

OTHER PUBLICATIONS

English translation of CN108508713, published Sep. 7, 2018. (Year: 2018).*

(Continued)

*Primary Examiner* — Christina A Riddle
(74) *Attorney, Agent, or Firm* — ROSSI, KIMMS & McDOWELL LLP

(57) ABSTRACT

Provided is a detection apparatus having a high detection accuracy.
A detection apparatus comprises an optical element arranged at a position optically conjugate to a target surface, including a first region for forming illumination light that illuminates the target surface with a first angle distribution and a second region for forming illumination light that illuminates the target surface with a second angle distribution, a measurement mark arranged at the target surface; and a detector for detecting a deviation direction and a deviation amount of the optical element based on reflection light from the measurement mark illuminated by the first region and the second region of the optical element.

15 Claims, 14 Drawing Sheets

(58) Field of Classification Search
CPC .............. G03F 9/7046; G03F 9/7065; G03F 9/7069–7088; G03F 9/7092; G03F 9/7096; G03F 7/0002; G03F 7/70608–70683; G03F 7/70141; G03F 7/70258; G03F 7/70975; G03F 7/70483; G03F 7/705; G03F 7/70605–706851; H01L 21/0271; H01L 21/027
USPC ... 355/18, 52–55, 67–77, 78, 83, 85, 86, 89, 355/95, 132; 356/399–401
See application file for complete search history.

(56) References Cited

U.S. PATENT DOCUMENTS

| | | | |
|---|---|---|---|
| 2014/0204357 A1* | 7/2014 | Nishida | G03F 9/7088 355/72 |
| 2018/0259863 A1* | 9/2018 | Komaki | G01D 5/28 |
| 2020/0409277 A1* | 12/2020 | Komaki | G03F 9/7065 |

OTHER PUBLICATIONS

English translation of JP2017-215429, published Dec. 7, 2017. (Year: 2017).*

* cited by examiner

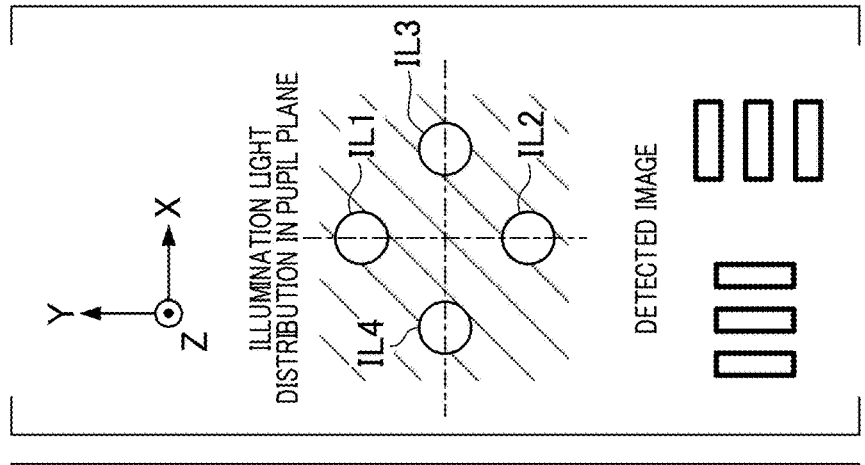
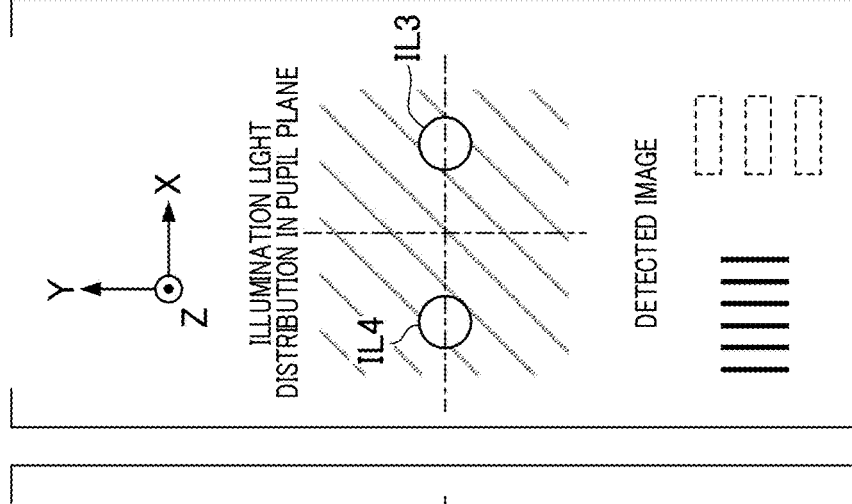
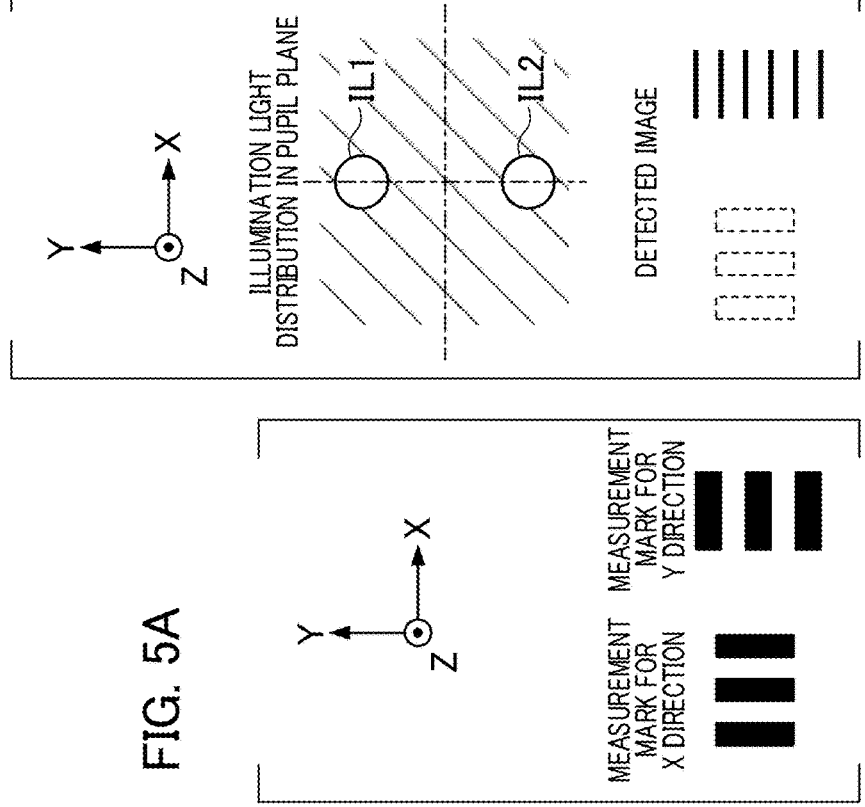

DETECTION APPARATUS, LITHOGRAPHY APPARATUS, ARTICLE MANUFACTURING METHOD, AND DETECTION METHOD

BACKGROUND OF THE INVENTION

Field of the Invention

The present invention relates to a detection apparatus, a lithography apparatus, an article manufacturing method, and a detection method.

Description of the Related Art

For example, in an imprint apparatus of a light photo-curing type, an imprint material such as a photo-curing resin is provided on a shot region as an imprint region on a substrate. Then, the imprint material is illuminated by light to be cured while a patter on a mold is pressed on the imprint material. The mold is then detached from the cured resin, so that a pattern of resin is formed on the substrate.

When imprinting the pattern of the mold on the imprint material on the substrate, it is necessary to accurately align the substrate and the mold. For aligning the substrate and the mold in an imprint apparatus, a so-called die-by-die method in which an alignment is performed by detecting a mark formed on the mold and a mark on the substrate is used.

In Japanese Patent Laid-Open No. 2017-41608, an imprint apparatus is disclosed, wherein a detector detects an alignment mark formed on the mold and an alignment mark on the substrate so as to detect a position on a surface of the substrate in X direction and Y direction. Specifically, an illumination region for illuminating an X mark for detecting X direction and an illumination region for illuminating an Y mark for detecting Y direction is provided, and light from the X mark and the Y mark illuminated by each of the illumination regions is picked up by an imaging device.

However, it is possible that the detector disclosed in Japanese Patent Laid-Open No. 2017-41608 erroneously detects the X mark outside the illumination region for illuminating the X mark, due to an installation error of an optical element such as a diffraction optical element. In that case, a measuring accuracy for measuring a position of the mark will be deteriorated or the measuring itself will fail.

Although it is possible to find a position where the measuring accuracy is high enough to succeed the measuring, by repeatedly measuring the mark while gradually shifting the position of the mark. However, in a circumstance where an installation position of the optical element varies depending on time, it is necessary to frequently perform manually adjusting, so that a cost for installing the apparatus increases and productivity is deteriorated. Therefore, one of objects of the present invention is to provide a detection apparatus having a high detection accuracy.

SUMMARY OF THE INVENTION

According to an aspect of the present invention, there is provided a detection apparatus comprising:
  an optical element arranged at a position optically conjugate to a target surface, including a first region for forming illumination light that illuminates the target surface with a first angle distribution and a second region for forming illumination light that illuminates the target surface with a second angle distribution;
  a measurement mark arranged at the target surface; and
  at least one processor or circuit configured to function as:
    a detector configured to detect a deviation direction and a deviation amount of the optical element based on reflection light from the measurement mark illuminated by the first region and the second region of the optical element.

Further features of the present invention will become apparent from the following description of embodiments with reference to the attached drawings.

BRIEF DESCRIPTION OF THE DRAWINGS

FIG. 4A is a diagram illustrating a moire fringe signal corresponding to light diffracted by patterns 2a and 3a. FIG. 4B is a diagram illustrating a moire fringe signal corresponding to light diffracted by patterns 2b and 3b. FIG. 4C is a diagram illustrating an intensity distribution in a cross section of the moire fringe signal of FIG. 4A.

FIGS. 5A to 5D are diagrams illustrating relationships between illumination light and detected images. FIG. 5A is a diagram illustrating a mark used for measuring a position in X direction and a mark used for measuring a position in Y direction. FIG. 5B is a diagram illustrating a detected image of light from a mark when the mark is illuminated by the illumination lights IL1 and IL2. FIG. 5C is a diagram illustrating a detected image of light from a mark illuminated by the illumination lights IL3 and IL4.

FIG. 5D is a diagram illustrating a detected image of light from a mark illuminated by the illumination lights ILL IL2, IL3, and IL4.

FIG. 8A is a diagram illustrating light diffracted in Y direction by an A region. FIG. 8B is a diagram illustrating light diffracted in X direction by a B region.

FIG. 9A is a diagram illustrating intensity distributions of light from the A region on the pupil plane. FIG. 9B is a diagram illustrating intensity distributions of light from the B region on the pupil plane.

DESCRIPTION OF THE EMBODIMENTS

Hereinafter, with reference to the accompanying drawings, favorable embodiments of the present invention will be described using Examples. In each diagram, the same reference signs are applied to the same members or elements, and duplicate description will be omitted or simplified.

Figure 1:
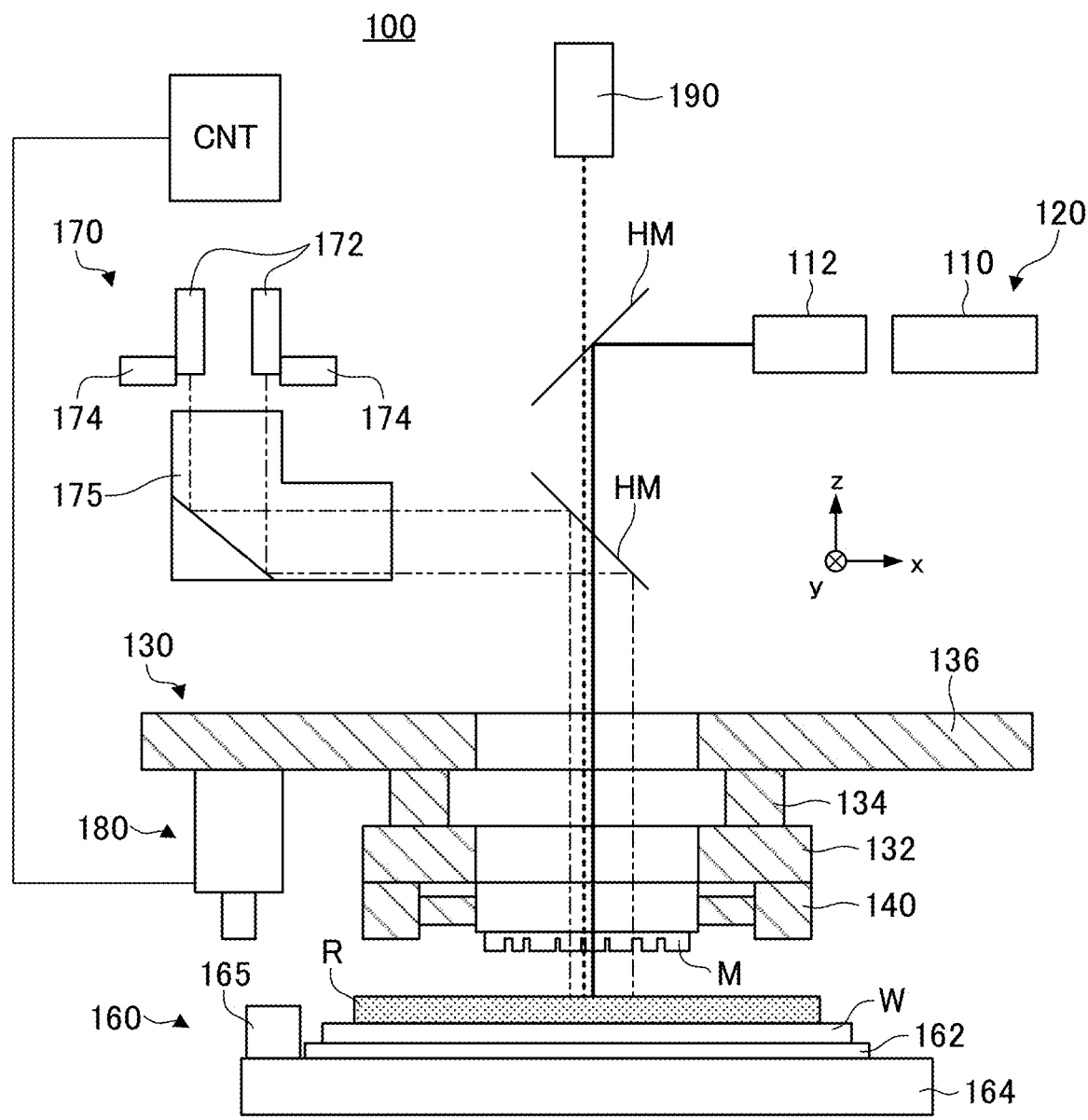
FIG. 1 is a schematic diagram illustrating an imprint apparatus.

FIG. 1 is a schematic diagram illustrating an imprint apparatus. The imprint apparatus of an embodiment is described using FIG. 1. In this embodiment, an imprint apparatus of a light photo-curing type that uses an UV light is described, wherein an imprint material such as a photo-curing resin is cured by the UV light. However, the invention can be applied to an imprint apparatus that uses light of other light wavelength or other energy such as heat for curing the resin.

In addition, the lithography apparatus may include an exposure apparatus that forms patterns by exposing a substrate by a light passing through a mask or a reticle. The lithography apparatus may also include a flattening apparatus that uses a mold having a flat pattern to flatten an imprint material on a substrate. Furthermore, the lithography apparatus may include a drawing apparatus that uses a charged particle beam such as an electron beam or an ion beam through a charged particle optical system so that a pattern is formed on a substrate.

The imprint apparatus 100 forms patterns on a plurality of shot regions on a substrate W, which is a wafer, by repeatedly performing an imprint process. The imprint process includes pressing a pattern of a mold M on an imprint material, and curing the imprint material so that a pattern is formed on a shot region on the substrate W. The imprint apparatus 100 includes a curing unit 120, a mold operation mechanism 130, a mold shape correction mechanism 140, a substrate driving unit 160, a detector 170, a coating mechanism 180, a monitor scope 190, and a controller CNT. The controller CNT includes a CPU as a computer and function a s control unit for controlling each part of the imprint apparatus 100 according to a computer program stored in a memory.

The imprint apparatus 100 also includes a bridge surface plate (not illustrated) for supporting the mold operation mechanism 13, a base surface plate (not illustrated) for supporting the substrate driving unit 160. In FIG. 1, an X axis and a Y axis are defined in a plane parallel to a surface of the substrate W, and a Z axis is defined in a direction perpendicular to the X axis and the Y axis as shown in FIG. 1.

The curing unit 120 illuminates the imprint material (resin/resist) R on the substrate W with an UV light via the mold M, which is transparent, to cure the imprint material. The imprint material R includes UV curable resin. The curing unit 120 includes, for example, a light source unit 110 and an optical system 112. The light source unit 110 includes, for example, a light source such as a mercury lamp that generates, for example, an UV light such as an i-line or a g-line, and includes an oval mirror for condensing light generated by the light source.

The optical system 112 includes a lens, an aperture, a half-mirror HM, and so on for illuminating the imprint material with the light for curing the imprint material R. The aperture is used for controlling an illumination angle and for shielding a peripheral part. By controlling the illumination angle, only a target shot region can be illuminated and by shielding the peripheral part, the UV light illumination beyond the shot region on the substrate can be restricted.

The optical system 112 may include an optical integrator for evenly illuminating the mold. The light whose angle is restricted by the aperture incidents on the imprint material R on the substrate via the imaging optical system in the optical system 112 and the mold M, while the mold M and the imprint material R contact each other. The mold M has an uneven three-dimensional pattern that corresponds to a circuit pattern and so on of a device. The material of the mold M is a quartz and so on that can transmit the UV light.

The mold operation mechanism 130 includes, for example, a mold chuck 132 that supports the mold M, a mold drive mechanism 134 that drive the mold chuck 132 to drive the mold M, and a mold base 136 that supports the mold drive mechanism 134. The mold drive mechanism 134 includes a positioning mechanism that controls a position of the mold M in 6 axes and a mechanism for pressing the mold M to the substrate W or the imprint material R on the substrate, and for separating the mold M from the imprint material R after the imprint material is cured. Here, the 6 axes include directions along the X axis, the Y axis, the Z axis, and directions around the X axis, the Y axis, and the Z axis in a XYZ coordinate system, where a X-Y plane is parallel to a support plane of the mold chuck 132 or a plane for supporting the substrate W, and the Z axis is perpendicular to the X-Y plane.

The mold shape correction mechanism 140 is mounted in the mold chuck 132. The mold shape correction mechanism 140 can correct a shape of the mold M by pressing the mold from outer circumferential side by cylinders that are driven with a fluid such as an air or an oil. Or, the mold shape correction mechanism 140 may include a heat control unit for controlling temperature of the mold M to corrects the shape of the mold M. The substrate W may also be deformed, such as inflated or contracted, by a process such as a heat process.

The mold shape correction mechanism 140 corrects the shape of the mold M corresponding to the deformation of the substrate W so that an overlay error between the pattern of the mold M and the pattern on the substrate W can be converged within a tolerance range The substrate driving unit 160 may include a substrate chuck 162 for supporting the substrate W, for example, by adsorbing it, a substrate stage 164 for driving the substrate W by driving the substrate chuck 162, and a stage drive mechanism (not illustrated).

The stage drive mechanism may include a positioning mechanism that controls the position of the substrate stage 164 in the 6 axes.

The detector (detecting apparatus) 170 includes, for example, an alignment scope 172, a stage mechanism 174, and an optical system 175. The detector 170 detects a relative position (position deviation) between the mold M and the shot region on the substrate W. The alignment scope 172 detects an alignment mark formed on the mold M and an alignment mark formed on the substrate W.

The stage mechanism 174 performs positioning of the alignment scope 172 based on the position of the mark on the substrate W. The optical system 175 includes a lens, an aperture, a mirror, a half-mirror, and so on for adjusting an optical path of the alignment scope 172.

The coating mechanism 180 coats the imprint material on the substrate W. The coating mechanism 180 may include a tank for storing the imprint material, a nozzle for delivering the imprint material supplied from the tank via a supply channel on the substrate, a valve provided in the supply channel, and a supply amount controller. The supply amount controller controls the valve to control an amount of imprint material supplied on the substrate W so that each shot region is coated with the imprint material typically by each delivering operation of the imprint material.

The monitor scope 190 is for monitoring a whole shot region and has an imaging device for picking up an image of a whole shot region. The monitor scope 190 is used for monitoring a condition of contact between the mold M and the imprint material R and for monitoring state of progress of filling of the imprint material R into the uneven pattern of mold M.

Next, the imprint process in the imprint apparatus 100 is described. First, the controller CNT transports the substrate W onto the substrate chuck 162 and the substrate W is chucked by the substrate chuck 162. Then, the controller CNT drives the substrate stage 164 to transport the substrate W to a coating position for the coating mechanism 180. Subsequently, the coating mechanism 180 performs coating (coating process) by delivering the imprint material R on a predetermined shot region (imprint region) on the substrate W. Then, the controller CNT moves the substrate stage 164 so that the coated region on the substrate W is positioned just below the mold M.

Subsequently, the controller CNT drives the mold drive mechanism 134 so that the mold M is pressed (imprinted) on the imprint material R on the substrate W, which is the imprint process. In this process, the imprint material R fills in the pattern formed on the mold M by the imprint operation of the mold M. In this condition, the detector 170 detects light from the mark arranged on the substrate W and the mark arranged on the mold M, and according to a result of the detection, the controller CNT drives the substrate stage 164 to perform alignment between the positions of the substrate W and the mold M, and performs correction of the shape of the mold M.

After completing the filling of the imprint material R into the pattern of the mold M, the alignment between the positions of the mold M and the substrate W, and the correction of the shape of the mold M, the curing unit 120 illuminates the UV light from the back surface (the upper surface) of the mold M. By this, the imprint material R is cured by the UV light passing through the mold M (curing process). Subsequently, the mold drive mechanism 134 is driven again to separate the mold M from the imprint material R on the substrate W (separation process), so that the uneven pattern on the mold M is transferred to the imprint material R on the substrate W.

Figure 2:
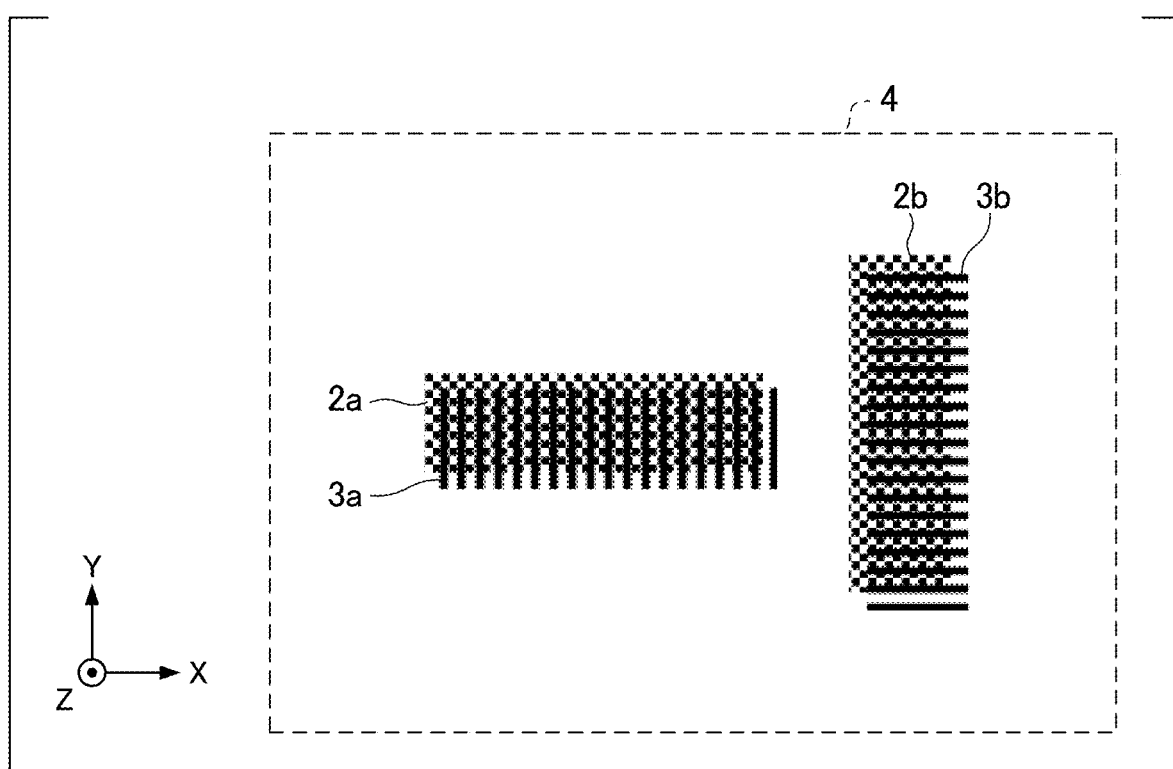
FIG. 2 is a diagram illustrating an alignment mark (measurement mark).

Next, the alignment mark of the present embodiment and the alignment scope S will be described using FIGS. 2 to 5. FIG. 2 is a diagram illustrating an alignment mark (measurement mark). In a mark monitoring region 4, patterns 2a and 2b as the alignment mark (measurement mark) formed on the mold M and patterns 3a and 3b as the alignment mark formed on the substrate W are viewed overlappingly. The mark monitoring region 4 corresponds to a monitor view of the alignment scope S.

In this connection, in a case where the lithography apparatus is the exposure apparatus that uses a reticle forming a pattern on the substrate, the patterns 2a and 2b as the alignment mark may be provided on the reticle. The patterns 2a and 2b are lattice patterns in a form of a checkerboard having a lattice pitch P1 in Y direction and lattice pitch P2 in X direction, while the patterns 3a and 3b are lattice patterns having a lattice pitch P3, which is different from the pitch P2, only in X direction.

When those two types of lattice patterns are overlapped, diffracted light from the lattice patterns interfere each other and form moire fringes (interference light) to be detected. The pattern 2a and the pattern 3a are marks (first alignment marks) used for detecting a relative position of the mold M and the substrate W in X direction. The pattern 2b and the pattern 3b are marks (second alignment marks) used for detecting a relative position of the mold M and the substrate W in Y direction. Here, a pitch of the pattern 2b in Y direction is different from a pitch of the pattern 3b in Y direction.

Figure 3:
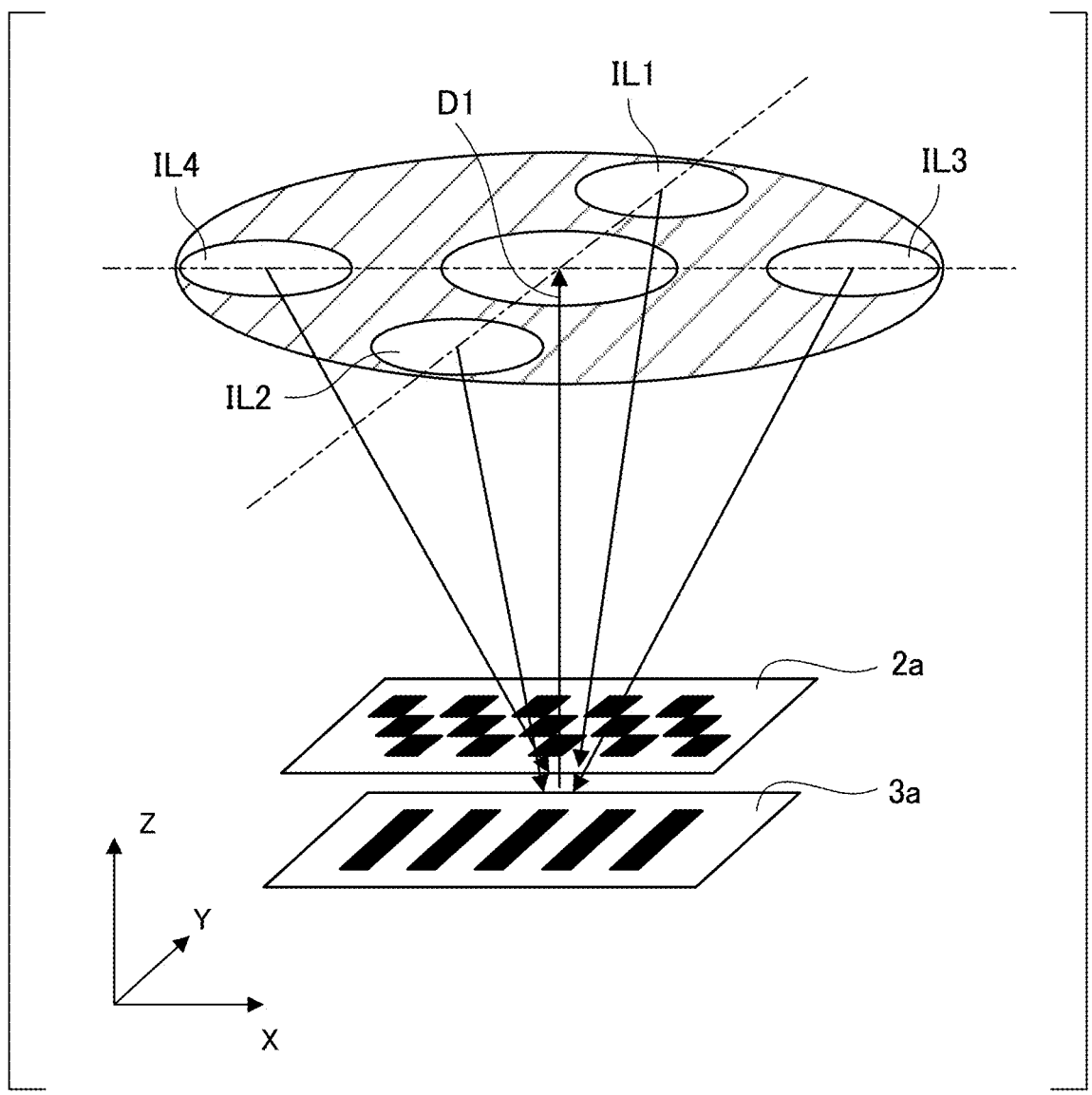
FIG. 3 is a view illustrating a way to illuminate the alignment mark to be detected.

FIG. 3 is a view illustrating a way to illuminate the alignment mark to be detected. In FIG. 3, the patterns 2a and 2b on the mold M, and the patterns 3a and 3b on the substrate W are illuminated by illumination lights IL1 to IL4, which are from a pupil plane of the illumination optical system, as shown in FIG. 3. The alignment scope S detects light from the patterns 2a and 3a, and light from the patterns 2b and 3b via the mold M and an aperture D1, which is a TTM (Through the Mold detection).

Figure 4A:
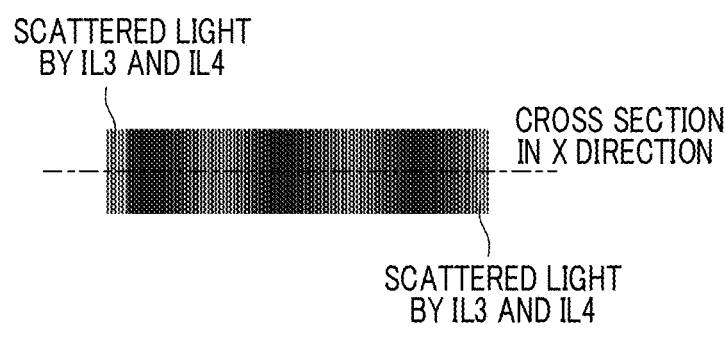
FIGS. 4A to 4C are diagrams illustrating detection signals corresponding to light from the alignment mark.
Figure 4B:
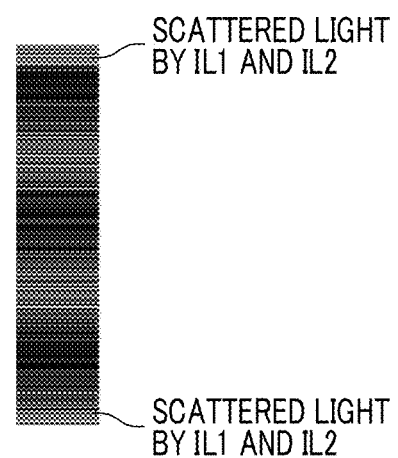
Figure 4C:
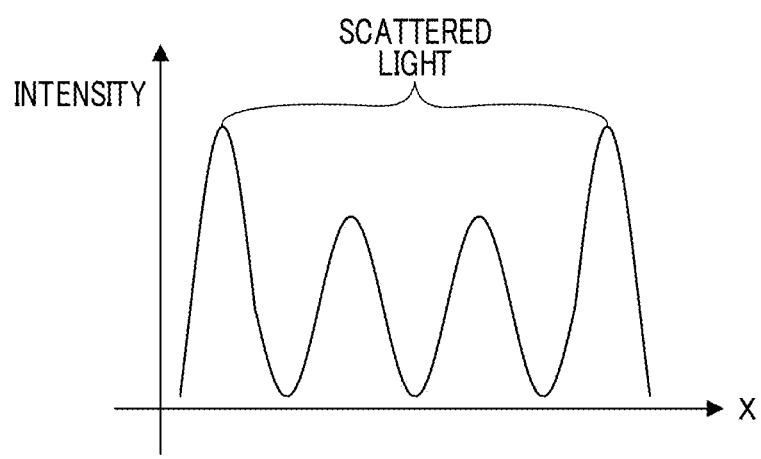

By this, the patterns 2a and 3a, and the pattern 2b and 3b can be simultaneously monitored by the alignment scope S. FIGS. 4A to 4C are diagrams illustrating detection signals corresponding to light from the alignment mark. FIG. 4A is a diagram illustrating a moire fringe signal corresponding to light diffracted by patterns 2a and 3a. FIG. 4B is a diagram illustrating a moire fringe signal corresponding to light diffracted by patterns 2b and 3b. The patterns 2a and 3a are illuminated by the illumination lights IL1 and IL2, and diffracted light from the patterns 2a and 3a are detected as a moire fringe signal, as shown in FIG. 4A, by the imaging device and so on.

By this moire fringe signal, a relative position between the patterns 2a and the pattern 3a, that is the relative position of the mold M and the substrate W can be calculated. The patterns 2b and 3b are illuminated by the illumination lights IL3 and IL4, and diffracted light from the patterns 2a and 3a are detected as a moire fringe signal, as shown in FIG. 4B, by the imaging device and so on.

Here, both the illumination lights IL1 and IL2 for measuring the patterns 2a and 3a, and the illumination lights IL3 and IL4 for measuring the patterns 2b and 3b illuminates the patterns 2a, 3a, 2b, and 3b. That is, the illumination lights ILL IL2, IL3, and IL4 simultaneously illuminate marks to simultaneously perform the measurement of positions in both X direction and Y direction.

As illustrated in FIG. 4A, when measuring the position in X direction, light from the illumination lights IL3 and IL4, which is not used in the measurement of the position in X direction, scatters at edges of the patterns 2a and 3a to generate flare light to mix into the moire fringe signal. FIG. 4C is a diagram illustrating an intensity distribution, which is a light intensity distribution on a light receiving surface of the imaging device, in a cross section of the moire fringe signal of FIG. 4A.

The light scattered at the edges of the patterns 2a and 3a mixes into the moire fringe signal and the peak levels at both end of the signal intensity are increased as shown in FIG. 4C. That is, as shown in FIG. 4C, two cycles out of four cycles of the moire fringe signal are influenced by the scattered light, so that this will deteriorate the accuracy of the measurement of positions. This is also the same with the measurement in Y direction. When measuring the position in Y direction, light from the illumination lights IL1 and IL2, which is not used in the measurement of the position in Y direction, scatters at edges of the patterns 2b and 3b to generate flare light to mix into the moire fringe signal.

In addition, in general, even in a case where marks that do not cause the moire fringe signal are used for position detection, unnecessary light for detection will scatter at edges to influence the accuracy of the measurement of positions. That will be described hereinafter referring to FIGS. 5A to 5D, which are diagrams illustrating relationships between illumination light and detected images. FIG. 5A is a diagram illustrating a mark (measurement mark) for measuring positions in X direction and a mark (measurement mark) for measuring positions in Y direction. FIG. 5B is a diagram illustrating a detected image of light from a mark illuminated by the illumination lights IL1 and IL2. That is, FIG. 5B illustrates the detection signal (detected image) corresponding to light from the mark detected by the imaging device, when the marks are illuminated by the illumination lights IL1 and IL2 of the pupil plane in the illumination optical system, and which have an angle distribution in Y direction.

When the marks are illuminated by the illumination lights IL1 and IL2, light from the mark for measuring positions in X direction is not detected, and only light from the mark for measuring positions in Y direction is detected. FIG. 5C is a diagram illustrating a detected image of light from a mark illuminated by the illumination lights IL3 and IL4. That is, FIG. 5C illustrates the detection signal (detected image) corresponding to light from the mark detected by the imaging device, when the marks are illuminated by the illumination lights IL3 and IL4 of the pupil plane in the illumination optical system, and which have an angle distribution in X direction. When the marks are illuminated by the illumination lights IL3 and IL4, light from the mark for measuring positions in Y direction is not detected, and only light from the mark for measuring positions in X direction is detected.

FIG. 5D is a diagram illustrating detected images of light from a mark illuminated by the illumination lights ILL IL2, IL3, and IL4. That is, FIG. 5D illustrates the detection signal (detected images) corresponding to light from the marks detected by the imaging device, when the marks are illuminated by the illumination lights ILL IL2, IL3, and IL4 of the pupil plane in the illumination optical system, and which have angle distributions in X direction and in Y direction. In FIG. 5D, light from the mark for measuring positions in Y direction and light from the mark for measuring positions in X direction are simultaneously detected, however, the illumination lights IL1 and IL2 scatters at edges of the mark for measuring positions in X direction and the illumination lights IL3 and IL4 scatters at edges of the mark for measuring positions in Y direction. In FIG. 5D, the scattered light is shown in black bold lines. Since the scattered light has a certain intensity in the measurement directions, the detection signals cause an error in the measurement.

The alignment scope 172 of the present embodiment can reduce the above problem. Hereinafter, details of the alignment scope 172 will be described referring to FIGS. 6 to 9. The alignment scope 172 includes an illumination optical system for illuminating the patterns 2a and 2b formed on the mold M and the patterns 3a and 3b on the substrate W, and a detection optical system for detecting the light from the patterns 2a and 3a, and the light from the patterns 2b and 3b. The patterns as the alignment marks are the same as the pattern mentioned above.

Figure 6:
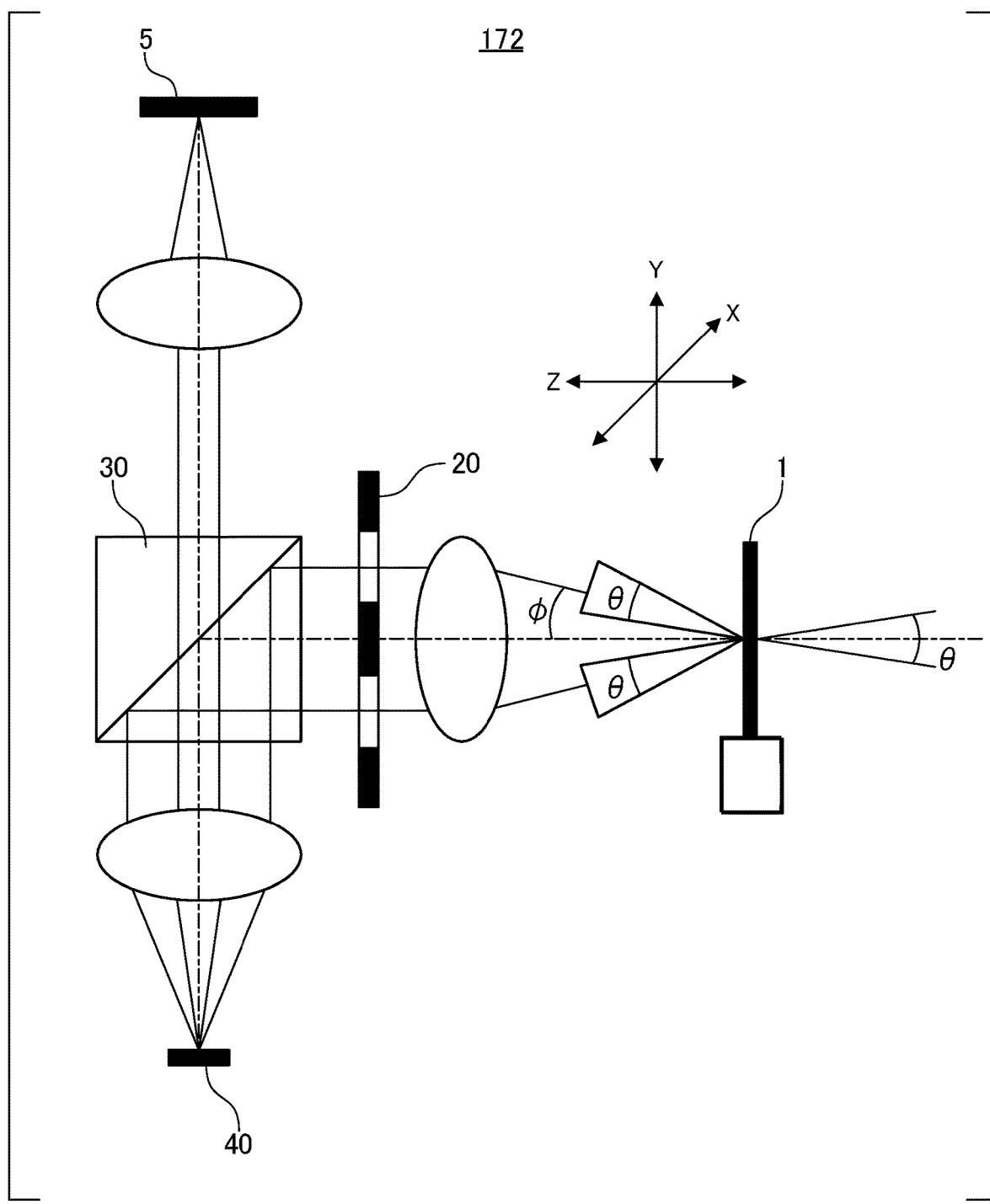
FIG. 6 is a diagram illustrating a construction of an alignment scope 172.

FIG. 6 is a diagram illustrating a construction of an alignment scope 172. In FIG. 6, the illumination optical system includes a light source (not illustrated), an optical element 1, an aperture mask 20 arranged in the pupil plane of the illumination optical system, and a splitter prism 30, and illuminates a mark monitoring surface 40 (surface to be illuminated). The mark monitoring surface 40 may be the surface of the mold M, which is monitored while moving the substrate stage 164 in X or Y direction, and moving the mold operation mechanism 130 in Z direction, or which is monitored while the mold M is pressed on the imprint material R.

In addition, the mark monitoring surface 40 may be the surface of the substrate W, which is monitored while the mold M is not contacting with the substrate W. Or, a stage reference plate 165 may be arranged on the substrate stage 164, and the mark monitoring surface 40 may be the surface of the stage reference plate 165. The detection optical system includes a light receiving device 5 and a lens system for focusing the light from the mark on a light receiving surface of the light receiving device 5. The splitter prism 30 also functions as the detection optical system.

The mark monitoring surface 40 is arranged at an optically conjugate position with respect to the optical element 1. That is, the optical element 1 is arranged at an optically conjugated position with respect to a target surface. The light from the alignment mark on the mark monitoring surface 40 passes through a transparent portion, which is around an optical axis, of the splitter prism 30, and incidents on the light receiving device 5. The light from the mark for measuring positions in X direction and the light from the mark for measuring positions in Y direction pass through the same lens (optical system), the transparent portion of the splitter prism 30, and incident on the light receiving device 5.

The aperture mask 20 is arranged at a Fourier transformation surface (pupil plane) of the optical element 1 and is used for shielding unnecessary light and 0 order light from the optical element 1. The aperture mask 20 transmits necessary light for illuminating the alignment mark through apertures, and shield the other unnecessary light. The light passing through the aperture of the aperture mask 20 is reflected by a reflection surface of the splitter prism 30, and illuminates the mark monitoring surface 40.

The optical element 1 may be a diffraction optical element, a micro lens array, a special modulator (digital mirror array), a prism and so on for deflecting light. The optical element 1 is arranged in an optical path of the illumination optical system for illuminating the image plane with light from the light source.

Figure 7:
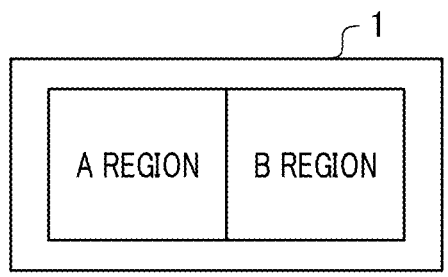
FIG. 7 is a diagram illustrating a construction of an optical element 1.
Figure 8A:
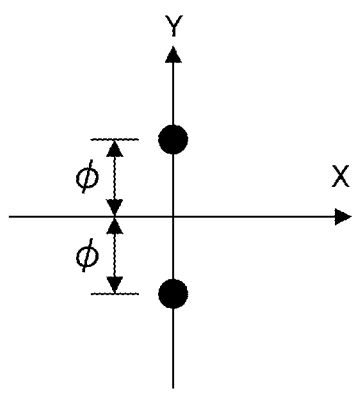
FIGS. 8A and 8B are diagrams illustrating the diffraction caused by the optical element 1.
Figure 8B:
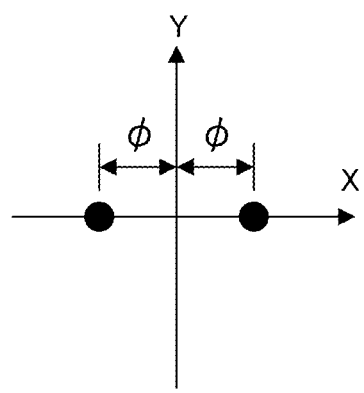

FIG. 7 is a diagram illustrating a construction of an optical element 1. In this embodiment, the optical element 1 is a diffraction optical element that has an A region (first region) that diffracts light at a diffraction angle φ in Y direction when light perpendicularly incidents on the optical element 1, and a B region (second region) that diffracts light at a diffraction angle φ in X direction when light perpendicularly incidents on the optical element 1. That is, the optical element 1 has a first region for forming illumination light that illuminates the target surface with a first angle distribution, and a second region for forming illumination light that illuminates the target surface with a second angle distribution different from the first angle distribution. FIGS. 8A and 8B are diagrams illustrating the diffraction caused by the optical element 1. FIG. 8A is a diagram illustrating light diffracted in Y direction by the A region, where light diffracted by the B region at diffraction angle φ in Y direction is shown by black dots. FIG. 8B is a diagram illustrating light diffracted in X direction by the B region, where light diffracted by the A region at diffraction angle φ in X direction is shown by black dots.

Figure 9A:
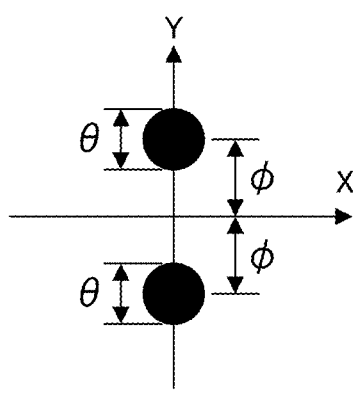
FIGS. 9A and 9B are diagrams illustrating intensity distributions of light on a pupil plane of an illumination optical system.
Figure 9B:
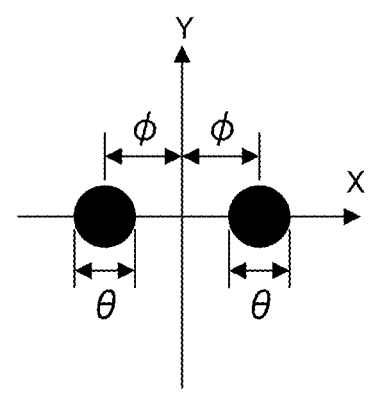

FIGS. 9A and 9B are diagrams illustrating intensity distributions of light on a pupil plane of an illumination optical system. FIG. 9A is a diagram illustrating intensity distributions of light from the A region on the pupil plane. FIG. 9B is a diagram illustrating intensity distributions of light from the B region on the pupil plane. Light flux incident on the A region at a maximum incident angle θ/2 is transformed to an intensity distribution of convolution of the angle θ and diffraction angle φ in Y direction, which are shown as two black dots in FIG. 9A, on the aperture mask 20 arranged in the pupil plane. A position on the mark monitoring surface 40 conjugate to the A region is illuminated by the light having the angle distribution (first angle distribution) shown in FIG. 9A. Similarly, light flux incident on the B region at a maximum incident angle θ/2 is transformed to an intensity distribution of convolution of the angle θ and diffraction angle φ in Y direction, which are shown as two black dots in FIG. 9A, on the aperture mask 20 arranged in the pupil plane. A position on the mark monitoring surface 40 conjugate to the A region is illuminated by the light having the angle distribution (first angle distribution) shown in FIG. 9B.

A position on the mark monitoring surface 40 conjugate to the B region is illuminated by the light having the angle distribution (second angle distribution) shown in FIG. 9B. In this connection, the A region and the B region are formed on one glass plate (one optical member) in this embodiment, however, the A region and the B region may be respectively formed on each of two glass plates arranged close to each other.

Figure 10:
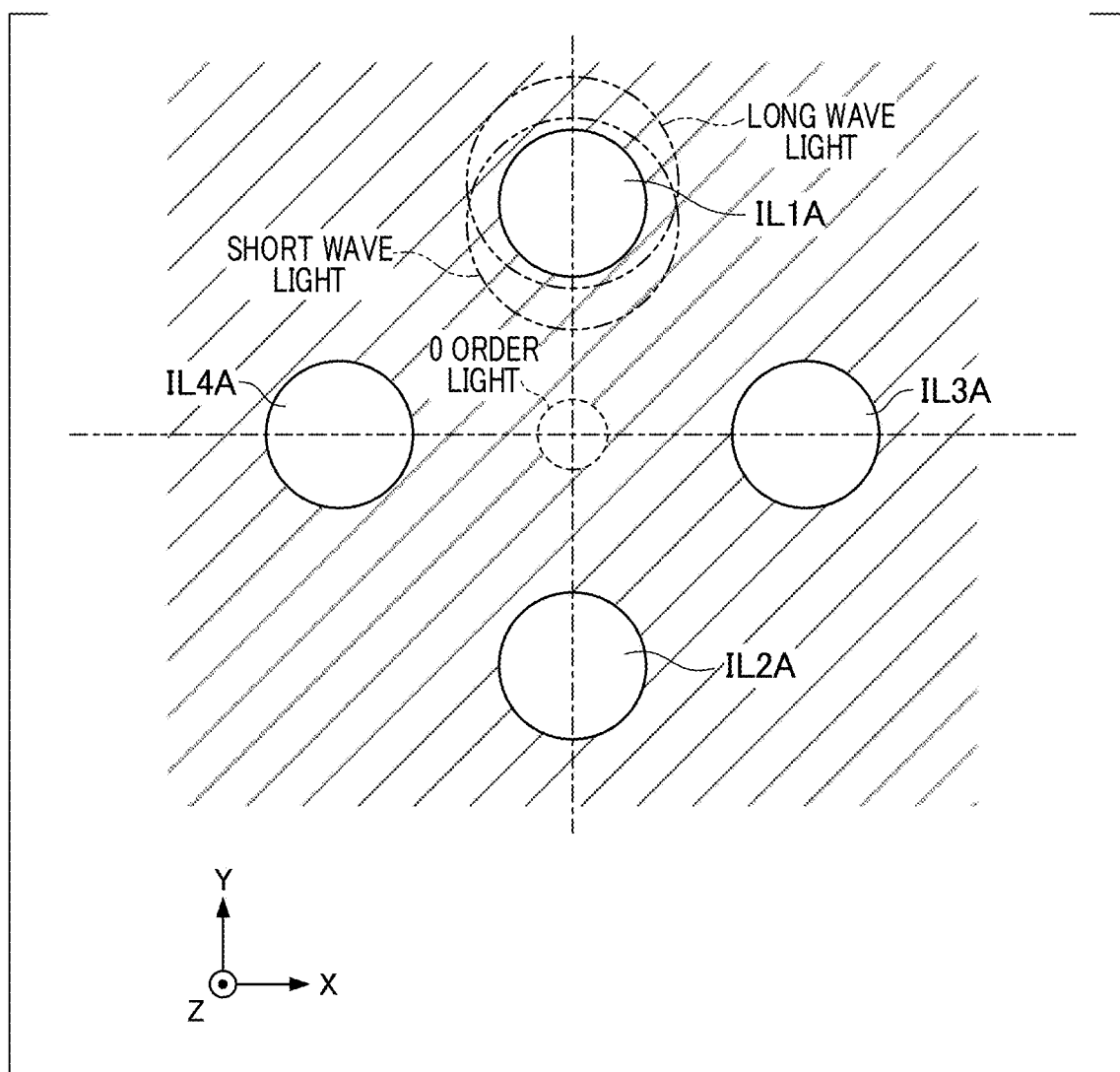
FIG. 10 is a diagram illustrating a construction of an aperture mask.

FIG. 10 is a diagram illustrating a construction of the aperture mask. The aperture mask 20 passes necessary light for illuminating the mark monitoring surface 40 through the apertures IL1A, IL2A, IL3A, and IL4A, while blocks the other unnecessary light by a light-shielding portion hatched in FIG. 10. Illumination light passing through the apertures IL1A and IL2A illuminates the mark monitoring surface 40 at a position corresponding to the A region, while illumination light passing through the apertures IL3A and IL4A illuminates the mark monitoring surface 40 at a position corresponding to the B region. The 0 order light from the optical element 1 is blocked by the light-shielding portion of the aperture mask 20.

The angle distribution of light illuminating the alignment mark at the position corresponding to the A region is the angle distribution in Y direction, which is the first angle distribution, while the angle distribution of light illuminating the alignment mark at the position corresponding to the B region is the angle distribution in X direction, which is the second angle distribution. On the mark monitoring surface 40, the position corresponding to the A region has a mark (first alignment mark) such as the pattern 2a and the pattern 3a for detecting the relative position of the mold M and the substrate W in X direction.

On the mark monitoring surface 40, the position corresponding to the B region has a mark (second alignment mark) such as the pattern 2b and the pattern 3b for detecting the relative position of the mold M and the substrate W in Y direction. The light receiving device 5 detects light from the first alignment mark illuminated by the first angle distribution and light from the second alignment mark illuminated by the second angle distribution.

As described in the above, the alignment scope 172 forms the illumination light having the angle distribution in Y direction on the mark monitoring surface 40 at the position corresponding to the A region, and forms the illumination light having the angle distribution in X direction on the mark monitoring surface 40 at the position corresponding to the B region. That is, on the mark monitoring surface 40, the position corresponding to the A region, where the first alignment mark is arranged, is not illuminated by the illumination light having the angle distribution in X direction. Therefore, the scattered light generated at edges in X direction of the mark for measuring positions in X direction caused by the illumination lights IL3 and IL4 in FIG. 5D is not generated.

In addition, on the mark monitoring surface 40, the position corresponding to the B region, where the second alignment mark is arranged, is not illuminated by the illumination light having the angle distribution in Y direction. Therefore, the scattered light generated at edges in Y direction of the mark for measuring positions in Y direction caused by the illumination lights IL1 and IL2 in FIG. 5D is not generated.

Figure 11:
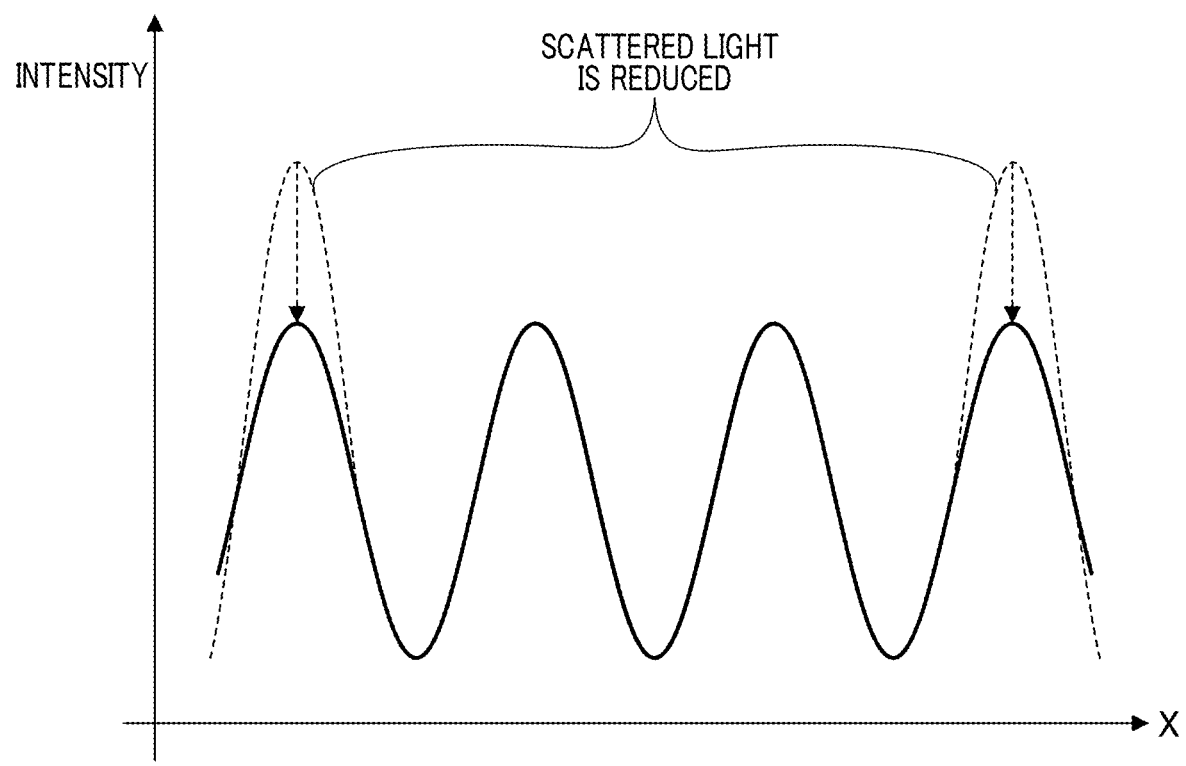
FIG. 11 is a diagram illustrating a detection signal by the alignment scope 172.

FIG. 11 is a diagram illustrating a detection signal by the alignment scope 172. In FIG. 11, an intensity distribution of the moire fringe signal with regard to a cross section in X direction is illustrated, wherein the moire fringe signal is generated by detecting light diffracted by the pattern 2a and the pattern 3a (first alignment mark) arranged at the position corresponding to the A region. In FIG. 11, at both ends in X direction of the signal intensity do not include scattered light component, therefore, the four cycles of the moire fringe signal used for measuring positions can be accurately detected. As described in the above, in a case where a plurality of marks for measuring in different directions are arranged, by illuminating each mark with respectively different angle distribution, light from each of the alignment marks can be accurately detected without causing light scattering by unnecessary light.

The moire fringe signal that corresponds to the light diffracted by the pattern 2a and the pattern 3a (first alignment mark), which correspond to the A region, is detected by the light receiving device 5 of the alignment scope 172 to be transmitted to a data processing unit such as the controller CNT. The data processing unit identifies peak positions of the moire fringe signal to obtain the relative position of the mold M and the substrate W (shot region) in X direction.

Since the moire fringe signal does not include unnecessary light component by the scattered light, S/N is high and the accuracy of the measuring positions can be improved. The controller CNT drives the substrate stage 164 according to the obtained relative position to perform positioning of the mold M and the substrate W (shot region). In this connection, the positioning of the mold M and the substrate W (shot region) may be performed based on the peak positions of the moire fringe signal, without obtaining the relative position.

Figure 12B:
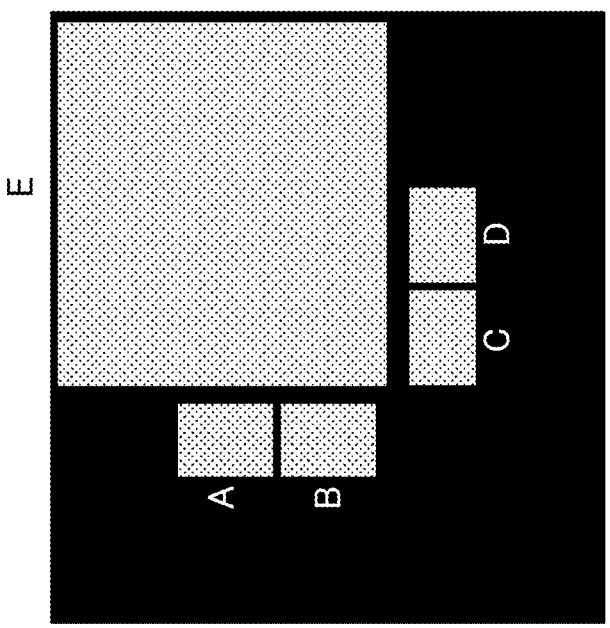
FIG. 12B is a diagram illustrating a condition when there is an installation error of the optical element.
Figure 12A:
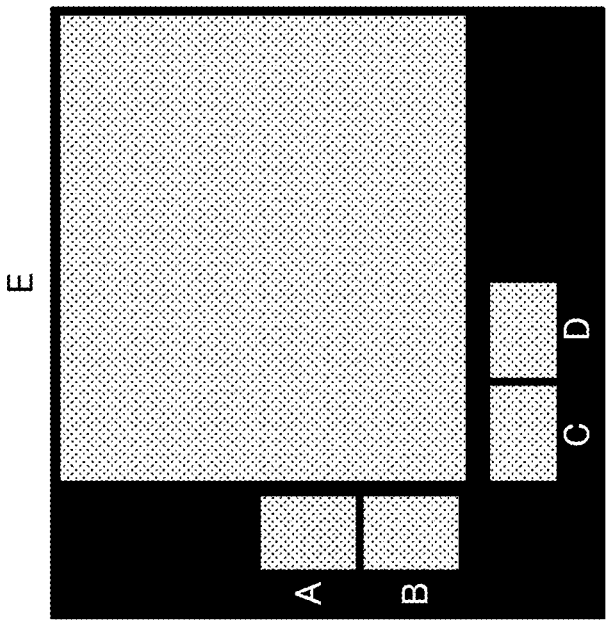
FIG. 12A is a diagram illustrating a condition when there is not an installation error of the optical element.

Next, FIG. 12A is a diagram illustrating a condition when there is not an installation error of the optical element 1 that has A region, B region, C region, D region, and E region, wherein the A region and the C region form illumination light having the angle distribution in Y direction, the B region and the D region form illumination light having the angle distribution in X direction, the E region forms illumination light having the angle distribution in X direction and Y direction. On the contrary, FIG. 12B is a diagram illustrating a condition when there is an installation error of the optical element 1 shown in FIG. 12A. In FIG. 12B, the whole optical element 1 is evenly deviated and is installed.

In FIG. 12B, since each region of the optical element 1 is deviated, even if the substrate stage 164 or the alignment scope 172 are moved according to the designed value, there is a possibility that the mark for measuring positions in X direction is illuminated by outside of the A region. Similarly, there is a possibility that the mark for measuring positions in Y direction is illuminated by outside of the B region. And if those alignment marks are illuminated by outside of proper regions, and if light from the alignment mark illuminated by outside of proper regions is detected by the light receiving device 5, the accuracy of measurement of mark positions will deteriorate or the measurement itself will fail, and accuracy of the alignment will deteriorate.

In this connection, black part in FIGS. 12A and 12B are light-shielding portion of the optical element 1, so that no signal is obtained from marks corresponding to the light-shielding portion. Therefore, if all the positions of marks are shifted to correspond to the light-shielding portions, the measurement itself will fail. The optical element 1 may include a transparent glass portion, in which light does not diffract, so that light incident on the aperture mask 20 from the transparent glass portion of the optical element 1 will be blocked by the aperture mask 20 as the 0 order light and a light-shielding portion is formed on the mark monitoring surface 40 (target surface). Therefore, black part in FIGS. 12A and 12B may be the transparent portion of the optical element 1.

In addition, if there is not any reflective material such as the mark for measuring, on the mark monitoring surface 40 (target surface), the illumination light does not diffract nor scatter, therefore, the splitter prism 30 does not transmit reflected light or diffracted light. In that condition, the light receiving device 5 cannot detect light from the mark monitoring surface 40 as if it is dark. Thus, in a case where all the regions of the optical element 1 are deviated from the marks on the mark monitoring surface 40 as shown in FIG. 12B, it is not possible to detect the deviation of the regions.

Therefore, in a case where the illumination light having the angle distribution in Y direction is formed by a portion corresponding to the A region, monitoring may be performed by using the scope while the substrate stage 164 or the alignment scope 172 is gradually moved. By this way, it is possible to detect how much amount the designed target position of the mark for measuring positions in X direction is deviated from the A region in X direction, and the drive position of the substrate stage 164 or the alignment scope 172 can be determined according to the deviation amount.

Thus, even if there is an installation error of the optical element 1, it is possible to measure the measurement mark. However, in a case where the installation position temporally changes, frequent manual measurement is necessary, so that operation cost increases or productivity deteriorates.

Figure 13C:
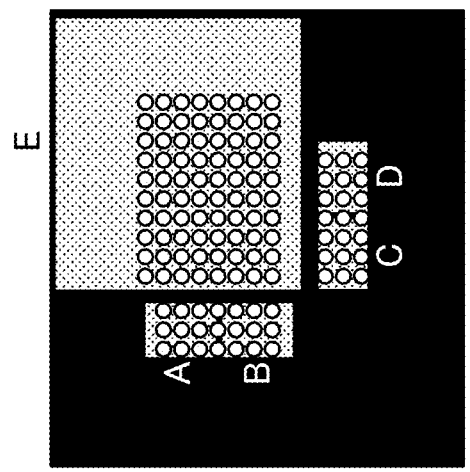
FIG. 13C is a diagram illustrating a condition where adjacent two sides of a corner of the hatching mark is detected.
Figure 13B:
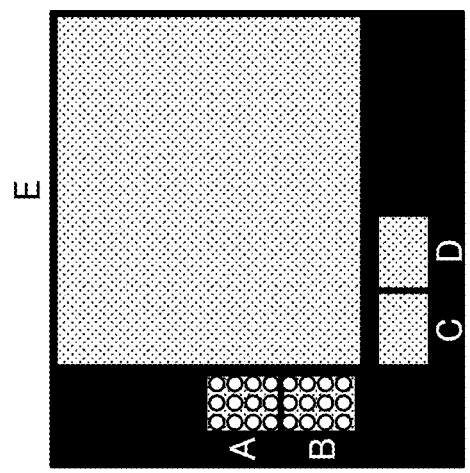
FIG. 13B is a diagram illustrating a condition where the substrate or the alignment scope is moved while the hatching mark is illuminated by the A region and the B region.
Figure 13A:
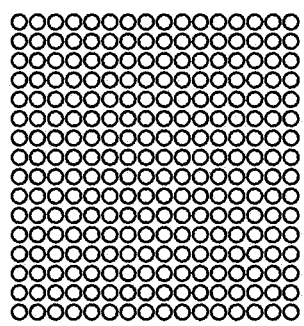
FIG. 13A is a diagram illustrating a hatching mark for measuring a deviation of regions.

Next, FIG. 13A is a diagram illustrating a hatching mark (measurement mark) for measuring a deviation of regions. In this embodiment, hatching mark shown in FIG. 13A as the mark for measuring deviation is arranged on the stage reference plate 165 shown in FIG. 1. That is, the hatching mark for measuring the deviation is arranged on the stage reference plate 165 (the target surface).

FIG. 13B is a diagram illustrating a condition where the substrate or the alignment scope is moved while the hatching mark is illuminated by the A region and the B region. As shown in FIG. 13B, while the hatching mark for measuring the deviation is illuminated, for example, by the A region (first region) and the B region (second region), the substrate stage 164 or the alignment scope 172 is moved. By this way, it is possible to detect two adjacent side of a corners of the hatching mark in a short period, while the hatching mark is illuminated. That is, the alignment scope 172 can detect the position of the mark for measuring the deviation by detecting light reflected by the mark for measuring the deviation while gradually shifting illuminate positions by the first region and the second region of the optical element 1.

And the installation error of the optical element 1 can be detected by detecting a deviation direction and a deviation amount of the optical element 1 when the adjacent two sides of a corner of the mark for measuring the deviation are detected. It goes without saying that if the adjacent two sides of a corner of the mark for measuring the deviation are detected as shown in FIG. 13C at the beginning, it is possible to detect the installation error of the optical element 1 without moving the illumination position by the first region and the second region.

As described in the above, the alignment scope as the detector detects a deviation direction and a deviation amount of the optical element based on reflection light from the measurement mark, which is the mark for measuring deviation, illuminated by the first region and the second region of the optical element. In this connection, as shown in FIGS. 12 to 16, since the first region and the second region are arranged apart from each other, it is easy to detect the adjacent two sides of a corner of the mark for measuring the deviation.

In addition, since a plurality of the first region and a plurality of the second region are arranged in the optical element 1, it takes less time to detect the adjacent two sides of a corner of the mark for measuring the deviation and based on a relationship among positions of the detected adjacent two sides of a corner of the hatching mark, the A region, and the B region, the deviation direction and the deviation amount of the optical element 1 can be detected.

Based on a statistical value such as an averaged value of positions of the adjacent two sides of a corner of the hatching mark detected by the alignment scope 172, the installation error of the optical element 1 can be automatically calculated, and an automatic position control can be performed so that the error becomes zero. That is, by obtaining the deviation direction and the deviation amount, the deviation of the illumination position can be corrected in advance, so that it is possible to accurately illuminate the alignment mark on the mold M and the alignment mark on the substrate W, for example, in an imprint apparatus.

Thus, it is possible to move, for example, the substrate stage so that the position of the optical element is deviated as shown in FIG. 12B can be corrected to the position of the optical element as shown in FIG. 12A in advance. Therefore, the alignment mark can be accurately illuminated, so that it is possible to perform accurate positioning in a short period. In this connection, instead of moving the substrate stage and so on, the position of the alignment scope 172 or the position of the optical element 1 may be moved.

In this embodiment, since hatching mark is used as the mark for measuring deviation, illuminating light scatters as edge of hatching mark, so that any of illumination light having the angle distribution in Y direction, illumination light having the angle distribution in X direction and illumination light having the angle distributions in X direction and in Y direction can be detected. In this connection, for detecting borders of the light-shielding portion and the hatching mark, it is possible to use either one of the A region and the B region, or both of the A region and the B region.

Furthermore, as shown in FIG. 13C, it may be possible to detect borders of the light-shielding portion and the hatching mark using regions not adjacent to each other from the A region, the B region, the C region, the D region, and the E region, and based on a statistical value such as an averaged value of borders, the installation error of the optical element 1 can be automatically calculated. By using the A region, the B region, the C region, the D region, the E region, or other plurality of regions, it is possible to detect the corner of the mark more quickly.

Figure 14A:
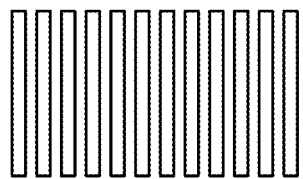
FIG. 14A is a diagram illustrating a mark in a form of a line-and-space in a lateral direction for measuring a deviation of regions.
Figure 14B:
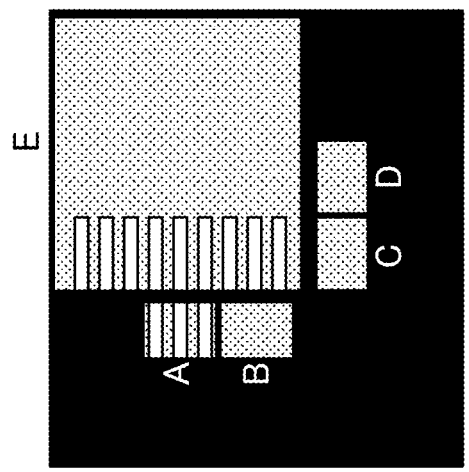
FIG. 14B is a diagram illustrating a condition where the substrate or the alignment scope is moved while the mark is illuminated by the A region and the B region.

Next, referring to FIGS. 14A to 14C, another embodiment of the mark for measuring deviation will be described. FIG. 14A is a diagram illustrating a mark (measurement mark) in a form of a line-and-space in a lateral direction for measuring a deviation of regions. In FIG. 14A, the mark for measuring deviation including a line-and-space pattern, which includes a plurality of parallel stripes, in X direction is arranged, for example, on the stage reference plate 165. FIG. 14B is a diagram illustrating a condition where the substrate or the alignment scope is moved while the mark is illuminated by the A region and the B region. In FIG. 14B, when moving the substrate stage 164 or the alignment scope 172 so that the marks are illuminated, for example, by both the A region and the B region, light from the pattern illuminated by the B region cannot be detected since the direction of the illumination light and the direction of the line-and-space pattern is different.

Figure 14C:
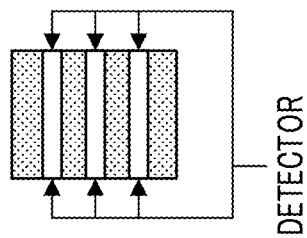
FIG. 14C is a diagram illustrating a condition where a border of the mark and the shielded region can be detected only in a predetermined direction.

On the contrary, light from the line-and-space pattern illuminated by the A region is detected, so that borders of the light-shielding portion and the line-and-space pattern in only one direction can be detected as shown in the arrow in FIG. 14C.

Figure 15A:
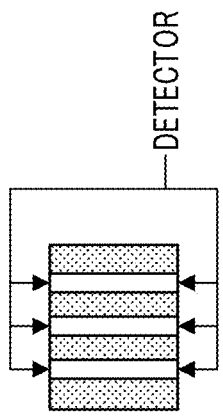
FIG. 15A is a diagram illustrating a mark in a form of a line-and-space in a longitudinal direction for measuring a deviation of regions.
Figure 15B:
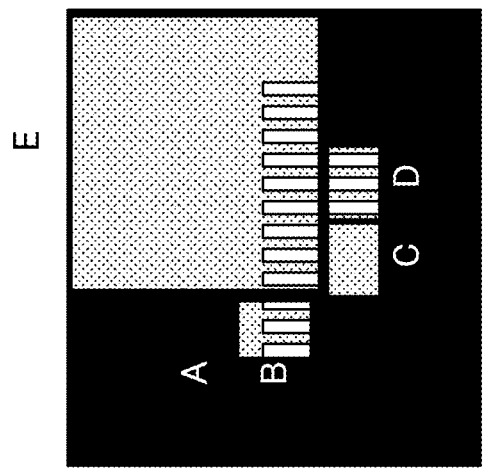
FIG. 15B is a diagram illustrating a condition where the substrate or the alignment scope is moved while the mark is illuminated by the C region and the D region.

Next, referring to FIGS. 15A to 15C, another embodiment of the mark for measuring deviation will be described. FIG. 15A is a diagram illustrating a mark (measurement mark) in a form of a line-and-space in a longitudinal direction for measuring a deviation of regions. FIG. 15B is a diagram illustrating a condition where the substrate or the alignment scope is moved while the mark is illuminated by the C region and the D region. In FIG. 15B, when moving the substrate stage 164 or the alignment scope 172 so that the marks are illuminated, for example, by both the C region and the D region, light from the pattern illuminated by the C region cannot be detected since the direction of the illumination light and the direction of the line-and-space pattern is different.

Figure 15C:
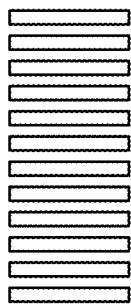
FIG. 15C is a diagram illustrating a condition where a border of the mark and the shielded region can be detected only in another direction.

On the contrary, light from the line-and-space pattern illuminated by the D region is detected, so that a border of the light-shielding portion and the line-and-space pattern in only one direction can be detected as shown in the arrow in FIG. 15C. As described in FIGS. 14 and 15, by using two types of line-and-space pattern for measuring deviation, the installation error of the optical element 1 in both the X direction and Y direction can be automatically calculated.

Figure 16A:
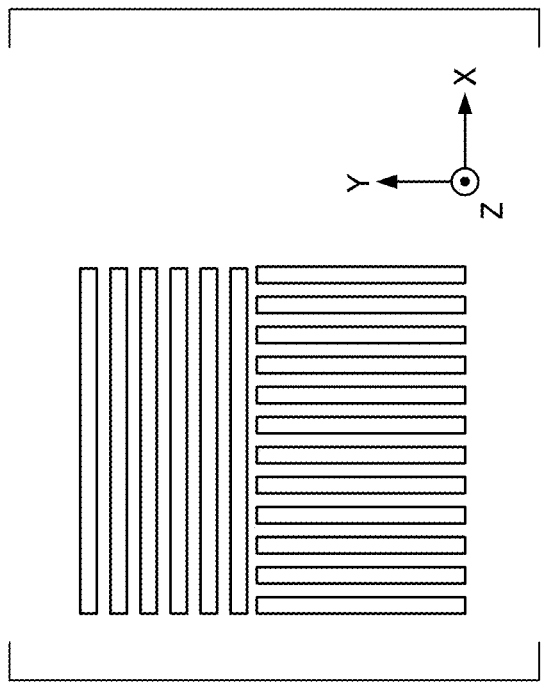
FIG. 16A is a diagram illustrating marks in a form of a line-and-space in a lateral direction and in a longitudinal direction for measuring a deviation of regions.
Figure 16B:
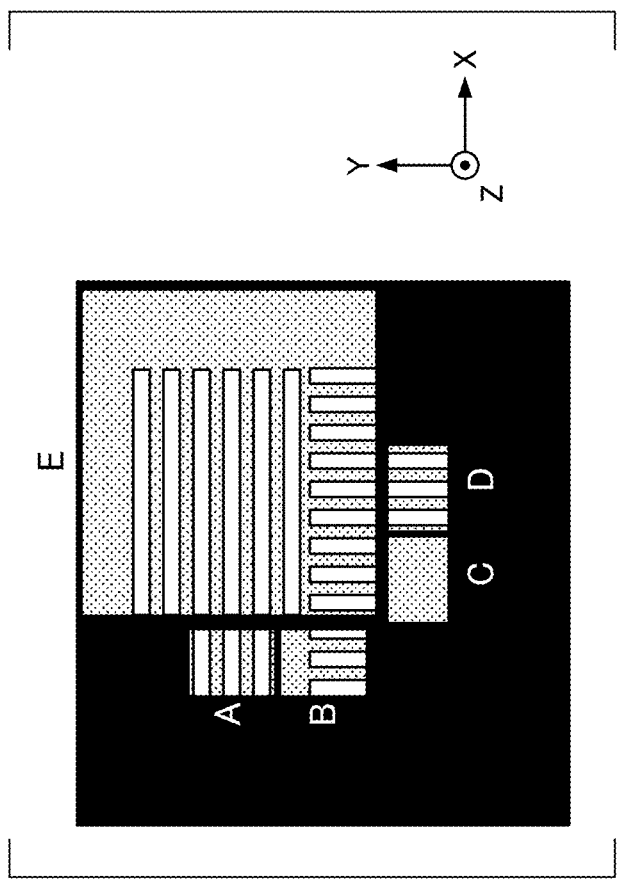
FIG. 16B is a diagram illustrating a condition where detection signals are obtained from the A, B, D regions.

Next, referring to FIGS. 16A and 16B, another embodiment of the mark for measuring deviation will be described. FIG. 16A is a diagram illustrating marks (measurement marks) in a form of a line-and-space in a lateral direction and in a longitudinal direction for measuring a deviation of regions. As shown in FIG. 16A, there are two types of line-and-space patterns, wherein one type is a line-and-space pattern in a lateral direction and the other type is a line-and-space pattern in a longitudinal direction perpendicular to the lateral direction. FIG. 16B is a diagram illustrating a condition where detection signals are obtained from the A, B, D regions. As illustrated in FIG. 16B, by using two types of the line-and-space patterns, it is possible to detect the deviation in X direction form the pattern illuminated by the A region, and the deviation in Y direction form the pattern illuminated by the B region and D region, so that the installation error of the optical element 1 in X and Y direction can be automatically calculated.

In this connection, another example of the alignment scope 172 may be using an aperture mask but not using the optical element 1, wherein the following operation may be sequentially performed. Firstly, using the aperture mask, illumination light having the first angle distribution is formed to illuminate a position corresponding to the A region and detect an image of the reflection light by a light receiving device. Subsequently, using the aperture mask, illumination light having the second angle distribution is formed to illuminate a position corresponding to the B region and detect an image of the reflection light by a light receiving device. The aperture mask may include a plurality of different apertures and at least one of the apertures may be selectively shielded from light or the aperture mask having different apertures may be rotated. Or, one of different types of aperture masks may be selectively inserted into an optical path, so that illumination having a plurality of different angle distribution can be selectively formed.

As described in the above, in the present embodiment, by using one of the regions of the optical element 1, illumination light having an angle distribution, for example, in one of X direction, Y direction, or XY directions is formed to illuminate the mark such as hatching mark for measuring deviation, and detecting the reflection light or the diffraction light from the mark. Therefore, detection of the border of the light-shielding portion and the corner of the mark for measuring deviation can be efficiently performed. Or, by illuminating a longitudinal line-and-space pattern with light having angle distribution in X direction and by detecting the reflected light, detection of the border of the light-shielding portion and the corner (adjacent two sides) of the mark for measuring deviation can be efficiently performed.

Or, by illuminating the lateral line-and-space pattern with light having angle distribution in Y direction and by detecting the reflected light, detection of the border of the light-shielding portion and the mark (adjacent two sides of a corner) for measuring deviation can be efficiently performed. In the present embodiment, by detecting those borders, efficiency for detecting the position deviation can be improved and the installation error of the optical element 1 can be properly corrected, so that the accuracy for detecting alignment mark can be improved.

[Method for Manufacturing an Article]

By using the detection apparatus or the detection method, articles such as a semiconductor IC device, a liquid crystal display device, a MEMS, a hard disk, color filters, and so on, can be manufactured with a lithography apparatus. That is, a method for manufacturing the article by using the detection apparatus of the present embodiment, includes a step for detecting a deviation direction and a deviation amount of an installation position of the optical element 1, a step for aligning a pattern of a mold or a reticle with a position of a substrate based on the deviation direction and the deviation amount. In addition, the method may include a step for forming a pattern on a substrate such as a wafer, a glass plate, a film shape substrate using a lithography apparatus such as the imprint apparatus or the exposure apparatus.

Furthermore, the manufacturing method may include a step for processing the substrate on which the pattern is formed by etching, dicing, and so on. In this connection, in a case where other article such as a patterned media (storage media), or an optical element, the manufacturing method may include other steps instead of the etching or the dicing for processing the substrate on which the pattern is formed. Since the method for manufacturing the article according to the embodiment uses the detection apparatus or the detection method according to the embodiment, the manufacturing method is advantageous in at least one of accuracy, efficiency, performance, quality, productivity, and production cost compared to conventional method.

While the present invention has been described with reference to exemplary embodiments, it is to be understood that the invention is not limited to the disclosed embodiments. The scope of the following claims is to be accorded the broadest interpretation to encompass all such modifications and equivalent structures and functions. In addition, as a part or the whole of the control according to this embodiment, a computer program realizing the function of the embodiment described above may be supplied to the detection apparatus or the lithography apparatus through a network or various storage media. Then, a computer (or a CPU, an MPU, or the like) of the detection apparatus or the lithography apparatus may be configured to read and execute the program. In such a case, the program and the storage medium storing the program configure the present invention.

This application claims the benefit of Japanese Patent Application No. 2020-70721 filed on Apr. 10, 2020, which is hereby incorporated by reference herein in its entirety.

What is claimed is:

1. A detection apparatus comprising:
an optical element arranged at a position optically conjugate to a target surface, including a first region for forming illumination light that illuminates the target surface with a first angle distribution and a second region for forming illumination light that illuminates the target surface with a second angle distribution, wherein each of the first region and the second region is surrounded by a light-shielding portion;
a measurement mark arranged at the target surface; and
at least one processor or circuit configured to function as:
a detector configured to detect a deviation direction and a deviation amount of the optical element by detecting a border of an area that at least one of the first region and the second region of the optical element illuminates and a border of an area of the light-shielding portion, which does not illuminate the measurement mark.

2. The detection apparatus according to claim 1, wherein the first region and the second region are arranged apart.

3. The detection apparatus according to claim 1, wherein the measurement mark includes a hatching mark.

4. The detection apparatus according to claim 1, wherein the measurement mark includes a line-and-space mark.

5. The detection apparatus according to claim 1, wherein the measurement mark includes two line-and-space marks arranged orthogonal to each other.

6. The detection apparatus according to claim 1, further comprising
an aperture arranged at a Fourier transformation surface of the optical element.

7. The detection apparatus according to claim 1, wherein the optical element includes a plurality of the first regions and plurality of the second regions.

8. A lithography apparatus for forming a pattern on a substrate comprising:
an optical element arranged at a position optically conjugate to a target surface, including a first region for forming illumination light that illuminates the target surface with a first angle distribution and a second region for forming illumination light that illuminates the target surface with a second angle distribution, wherein each of the first region and the second region is surrounded by a light-shielding portion;
a measurement mark arranged at the target surface; and
at least one processor or circuit configured to function as:
a detector configured to detect a deviation direction and a deviation amount of the optical element by detecting a border of an area that at least one of the first region and the second region of the optical element illuminates and a border of an area of the light-shielding portion, which does not illuminate the measurement mark; and
an alignment unit configured to align a pattern of a mold or a reticle with a substrate based on the deviation direction and the deviation amount detected by the detector.

9. The lithography apparatus according to claim 8, further comprising
an alignment mark on the mold or the reticle and another alignment mark on the substrate.

10. An article manufacturing method using a lithography apparatus having
an optical element arranged at a position optically conjugate to a target surface, including a first region for forming illumination light that illuminates the target surface with a first angle distribution and a second region for forming illumination light that illuminates the target surface with a second angle distribution, wherein each of the first region and the second region is surrounded by a light-shielding portion;
a measurement mark arranged at the target surface;
the article manufacturing method comprising:
detecting a deviation direction and a deviation amount of the optical element by detecting a border of an area that at least one of the first region and the second region of the optical element illuminates and a border of an area of the light-shielding portion, which does not illuminate the measurement mark; and
aligning a pattern of a mold or a reticle with a substrate based on the deviation direction and the deviation amount detected by the detecting;
forming a pattern on the substrate; and
processing the substrate on which the pattern is formed to manufacture the article.

11. A detection method using a detection apparatus having
an optical element arranged at a position optically conjugate to a target surface, including a first region for forming illumination light that illuminates the target surface with a first angle distribution and a second region for forming illumination light that illuminates the target surface with a second angle distribution, wherein each of the first region and the second region is surrounded by a light-shielding portion;

a measurement mark arranged at the target surface;

the detection method comprising:

detecting a deviation direction and a deviation amount of the optical element by detecting a border of an area that at least one of the first region and the second region of the optical element illuminates and a border of an area of the light-shielding portion, which does not illuminate the measurement mark.

12. A detection apparatus comprising:

an optical element arranged at a position optically conjugate to a target surface, including an illumination region for illuminating the target surface and a light-shielding portion that surrounds the illumination region;

a light receiving device that detects a light from a measurement mark arranged at the target surface; and at least one processor or circuit configured to function as:

a detector configured to detect a deviation of the optical element by detecting a border of an area, that the light receiving device receives a reflected light from, of the measurement mark illuminated by the illumination region and a border of an area of the light-shielding portion, which does not illuminate the measurement mark.

13. A lithography apparatus for forming a pattern on a substrate comprising:

an optical element arranged at a position optically conjugate to a target surface, including an illumination region for illuminating the target surface and a light shielding portion that surrounds the illumination region;

a light receiving device that detects a light from a measurement mark arranged at the target surface; and at least one processor or circuit configured to function as:

a detector configured to detect a deviation of the optical element by detecting a border of an area, that the light receiving device receives a reflected light from, of the measurement mark illuminated by the illumination region and a border of an area of the light-shielding portion, which does not illuminate the measurement mark; and an alignment unit configured to align a pattern of a mold or a reticle with a substrate based on the deviation detected by the detector.

14. An article manufacturing method using a lithography apparatus having an optical element arranged at a position optically conjugate to a target surface, including an illumination region for illuminating the target surface and a light shielding portion that surrounds the illumination region;

a light receiving device that detects a light from a measurement mark arranged at the target surface; and at least one processor or circuit configured to function as:

a detector configured to detect a deviation of the optical element by detecting a border of an area, that the light receiving device receives a reflected light from, of the measurement mark illuminated by the illumination region and a border of an area of the light-shielding portion, which does not illuminate the measurement mark;

the article manufacturing method comprising:

forming a pattern on the substrate; and processing the substrate on which the pattern is formed to manufacture the article.

15. A detection method using a detection apparatus having an optical element arranged at a position optically conjugate to a target surface, including an illumination region for illuminating the target surface and a light shielding portion that surrounds the illumination region;

a light receiving device that detects a light from a measurement mark arranged at the target surface;

the detection method comprising:

detecting a deviation of the optical element by detecting a border of an area, that the light receiving device receives a reflected light from, of the measurement mark illuminated by the illumination region and a border of an area of the light-shielding portion, which does not illuminate the measurement mark.

* * * * *